(12) United States Patent
Milner et al.

(10) Patent No.: US 12,385,953 B2
(45) Date of Patent: Aug. 12, 2025

(54) CURRENT SENSING BY USING AGING SENSE TRANSISTOR

(71) Applicant: Infineon Technologies Canada Inc., Ottawa (CA)

(72) Inventors: Lucas Andrew Milner, Sunnyvale, CA (US); Marco A. Zuniga, Berkeley, CA (US); Nan Xing, Allen, TX (US); Robert Wayne Mounger, Dallas, TX (US); Edward Macrobbie, Nepean (CA); Sridhar Ramaswamy, Allen, TX (US); Ahmad Mizannojehdehi, Stittsville (CA); Thomas William Macelwee, Nepean (CA)

(73) Assignee: Infineon Technologies Canada Inc., Ottawa (CA)

( * ) Notice: Subject to any disclaimer, the term of this patent is extended or adjusted under 35 U.S.C. 154(b) by 127 days.

(21) Appl. No.: 18/322,441

(22) Filed: May 23, 2023

(65) Prior Publication Data
US 2024/0393374 A1    Nov. 28, 2024

(51) Int. Cl.
G01R 19/00    (2006.01)
(52) U.S. Cl.
CPC .............................. G01R 19/0092 (2013.01)
(58) Field of Classification Search
None
See application file for complete search history.

(56) References Cited

U.S. PATENT DOCUMENTS

| 4,553,084 A | 11/1985 | Wrathall |
| 10,014,851 B2 * | 7/2018 | Chauhan ............. H03K 17/687 |
| 11,411,562 B2 * | 8/2022 | Tranca ................. H03K 19/094 |
| 2012/0161733 A1 * | 6/2012 | Hua ........................ G05F 1/565 |
| | | 323/282 |
| 2016/0087622 A1 * | 3/2016 | Kaeriyama ........ H03K 17/0828 |
| | | 327/109 |
| 2017/0201251 A1 * | 7/2017 | Chandrasekaran ........................ |
| | | H03K 17/6871 |

(Continued)

FOREIGN PATENT DOCUMENTS

WO    2024189603 A1    9/2024

OTHER PUBLICATIONS

European Search Report Received for Application No. / Patent No. (24177328.2-1001) on Oct. 22, 2024. 11 Pages.

*Primary Examiner* — Dominic E Hawkins
(74) *Attorney, Agent, or Firm* — WORKMAN NYDEGGER

(57) ABSTRACT

A current sense circuit that allows for accurate sensing of a power current that flows through a power transistor as the power transistor ages. The circuit includes the power transistor, a sense transistor and a pull-up component. The control nodes of the power transistor and the sense transistor are connected, causing the power transistor and sense transistor to be on or off simultaneously. The pull-up component is connected between the input node of the power transistor and the input node of the sense transistor. When power is provided to the pull-up component, and when each of the power transistor and sense transistor are off, the pull-up component forces a voltage present at the sense transistor input node to be approximately equal to a voltage present at the power transistor input node, causing the sense and power transistors to age together.

19 Claims, 4 Drawing Sheets

(56) References Cited

U.S. PATENT DOCUMENTS

2019/0097525 A1* 3/2019 Nakao ............... H02M 3/33515
2019/0260376 A1 8/2019 Zuniga et al.

* cited by examiner

CURRENT SENSING BY USING AGING SENSE TRANSISTOR

BACKGROUND

Electronic circuits typically include transistors, which function as electronic switches that regulate or control current flow in portions of the circuit. One type of transistor is a field-effect transistor in which a voltage is applied to a gate terminal to turn the transistor on and off. A semiconductor channel region is disposed between the drain terminal and the source terminal. When the transistor is on, current flows through the semiconductor channel region between the source terminal and the drain terminal. When the transistor is off, lesser or no current flows through the semiconductor channel region between the source terminal and the drain terminal. The gate terminal is disposed over the semiconductor channel region between the source terminal and the drain terminal. Voltage on the gate terminal generates a field that affects whether the semiconductor channel region conducts current-hence the term "field-effect transistor".

Nevertheless, there are other types of transistors. In each transistor, current flows from an input node to an output node through a channel when the transistor is turned on by applying a sufficient voltage to a control node. For instance, in a field-effect transistor, the control node would be the gate terminal, the input node would be one of the source or drain terminals, and the output node would be the other of the source or drain terminals.

Typical transistors are used for amplifying and switching purposes in electronic circuits. On the other hand, power transistors are used to convey more substantial current, have higher voltage ratings, and may more typically be used in power supplies, battery charging, and the like. Power transistors can typically operate with currents greater than 1 amp to as much as a hundred amps or even greater. Power transistors may convey power greater than 1 watt to as many as hundreds of watts or even greater.

The subject matter claimed herein is not limited to embodiments that solve any disadvantages or that operate only in environments such as those described above. Rather, this background is only provided to illustrate one example technology area where some embodiments described herein may be practiced.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Embodiments described herein relate to a current sense circuit that allows for accurate sensing of a power current that flows through a power transistor as the power transistor ages. The circuit includes the power transistor and a sense transistor. The power transistor and the sense transistor each include a control node (e.g., a gate terminal if a field-effect transistor), an input node (e.g., a drain terminal if a field-effect transistor) from which current flows, and an output node (e.g., a source terminal if a field-effect transistor) to which current flows. The control nodes of the power transistor and the sense transistor are connected. Because the control nodes of the power transistor and the sense transistor are connected, both the power transistor and sense transistor are likely to be on or off at the same time.

When the current sense circuit is on (i.e., when the power transistor and sense transistor are each on), a power current is passed through the power transistor, and a sense current is passed through the sense transistor. The power current may be very large and thus may be difficult to measure directly. The sense current may be much smaller than, but proportional to, the power current. Thus, the sense current can be more easily measured, and a signal representing the power current may be generated using the proportionality between the sense current and the power current.

When transistors are turned off, there is typically some voltage drop between the input node and the output node of that transistor. Power transistors may be used to handle hundreds of volts. Thus, while a power transistor is off, the voltage drop between the input node and the output node of the power transistor may also be hundreds of volts. Power transistors are susceptible to "aging" over time due to high electric fields caused by such large voltage drops. When a power transistor experiences aging, it may have an increase in internal resistance while the power transistor is on. This causes the power transistor to be less efficient at passing current and causes an increase in power lost due to heat.

Over time, the power transistor may experience more aging than its accompanying sense transistor, particularly if the power transistor and the sense transistor are not exposed to the same large voltage drop while off. Thus, over time, the sense current measured through the sense transistor may no longer accurately reflect the proportional power current passing through the power transistor. Accordingly, the sense current may no longer be used to accurately generate a signal representing the power current.

To solve this issue, the current sense circuit also includes a pull-up component. The pull-up component is connected between the input node of the power transistor and the input node of the sense transistor. When power is provided to the pull-up component, and when each of the power transistor and sense transistor is off, the pull-up component forces (or is configured to force) a voltage present at the sense transistor input node to be approximately equal to (or at least more towards) a voltage present at the power transistor input node. Thus, each of the power transistor and sense transistor are exposed to approximately the same voltage drop while off. Accordingly, each of the power transistor and sense transistor may experience aging at a similar rate, and over time, may both have a proportional increase in internal resistance while on. Thus, after the power transistor has aged significantly, its accompanying sense transistor has also aged proportionally, and the sense current passing through the sense transistor may still be used to accurately generate a signal representing the power current passing through the power transistor.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the advantages and features of the systems and methods described herein can be obtained, a more particular description of the embodiments briefly described above will be rendered by reference to specific embodiments thereof which are illustrated in the appended drawings. Understanding that these drawings depict only typical embodiments of the systems and methods described herein, and are not therefore to be considered to be limiting of their scope, certain systems and methods will be described and explained with additional specificity and detail through the use of the accompanying drawings in which.

DETAILED DESCRIPTION

Figure 1:
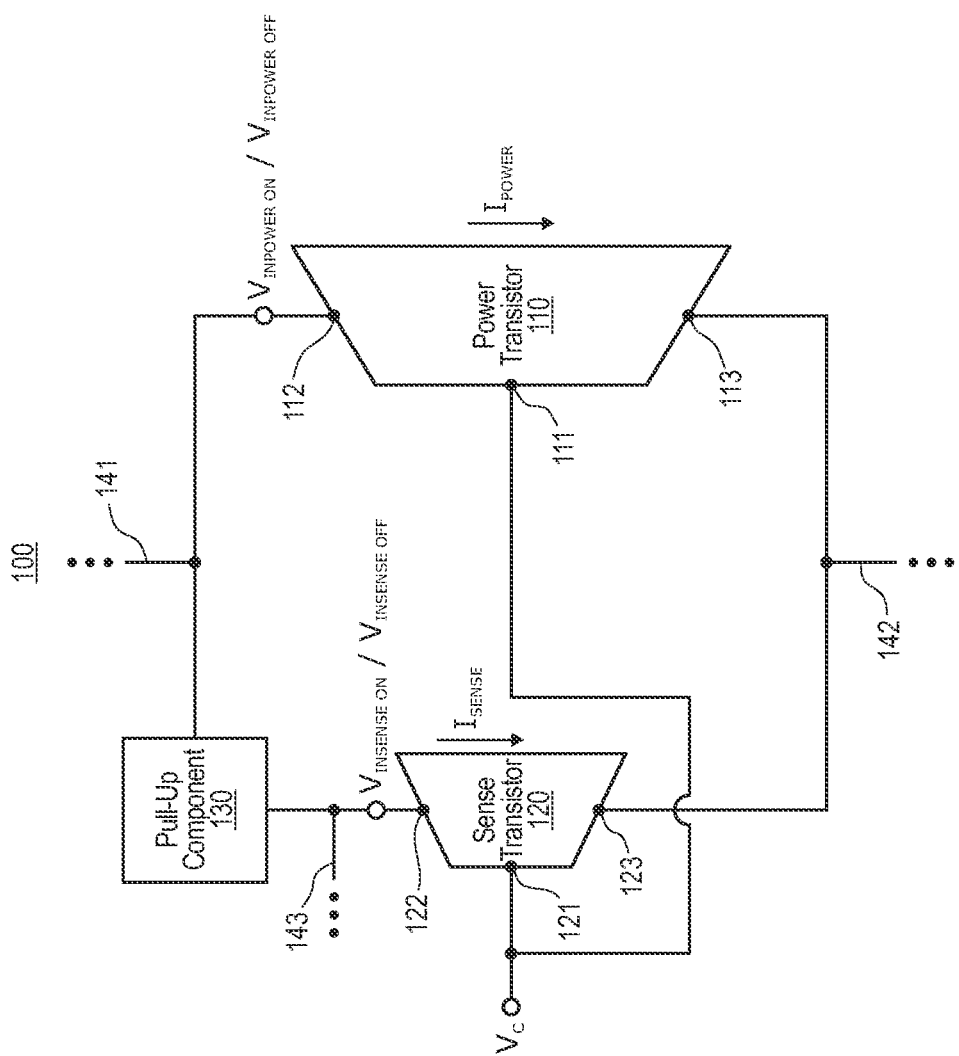
FIG. 1 illustrates a current sense circuit in which the principles described herein may be practiced, in which a sense transistor is aged more proportionate to a power transistor by forcing some pull up of the input voltage of the sense transistor when the sense transistor is off.

Embodiments described herein relate to a current sense circuit that allows for accurate sensing of a power current that flows through a power transistor as the power transistor ages. The circuit includes the power transistor and a sense transistor. The power transistor and the sense transistor each include a control node (e.g., a gate terminal if a field-effect transistor), an input node (e.g., a drain terminal if a field-effect transistor) from which current flows, and an output node (e.g., a source terminal if a field-effect transistor) to which current flows. The control nodes of the power transistor and the sense transistor are connected, and the output nodes of the power transistor and sense transistor are connected. Because the control nodes of the power transistor and the sense transistor are connected, both the power transistor and sense transistor are likely to be on or off at the same time.

When the current sense circuit is on (i.e., when the power transistor and sense transistor are each on), a power current is passed through the power transistor, and a sense current is passed through the sense transistor. The power current may be very large and thus may be difficult to measure directly. The sense current may be much smaller than, but proportional to, the power current. Thus, the sense current can be more easily measured, and a signal representing the power current may be generated using the proportionality between the sense current and the power current.

When transistors are turned off, there is typically some voltage drop between the input node and the output node of that transistor. Power transistors may be used to handle hundreds of volts. Thus, while a power transistor is off, the voltage drop between the input node and the output node of the power transistor may also be hundreds of volts. Power transistors are susceptible to "aging" over time due to high electric fields caused by such large voltage drops. When a power transistor experiences aging, it may have an increase in internal resistance while the power transistor is on. This causes the power transistor to be less efficient at passing current and causes an increase in power lost due to heat.

Over time, the power transistor may experience more aging than its accompanying sense transistor, particularly if the power transistor and the sense transistor are not exposed to the same large voltage drop while off. Thus, over time, the sense current measured through the sense transistor may no longer accurately reflect the proportional power current passing through the power transistor. Accordingly, the sense current may no longer be used to accurately generate a signal representing the power current.

To solve this issue, the current sense circuit also includes a pull-up component. The pull-up component is connected between the input node of the power transistor and the input node of the sense transistor. When power is provided to the pull-up component, and when each of the power transistor and sense transistor is off, the pull-up component forces (or is configured to force) a voltage present at the sense transistor input node to be approximately equal to (or at least more towards) a voltage present at the power transistor input node. Thus, each of the power transistor and sense transistor are exposed to approximately the same voltage drop while off. Accordingly, each of the power transistor and sense transistor may experience aging at a similar rate, and over time, may both have a proportional increase in internal resistance while on. Thus, after the power transistor has aged significantly, its accompanying sense transistor has also aged proportionally, and the sense current passing through the sense transistor may still be used to accurately generate a signal representing the power current passing through the power transistor.

FIG. 1 illustrates a current sense circuit 100 in which the principles described herein may be practiced. The current sense circuit 100 is just one embodiment of the principles described herein. The current sense circuit 100 includes a power transistor 110, a sense transistor 120 and a pull-up component 130. The pull-up component 130 will be described further below. The power transistor 110 is larger than the sense transistor 120. The size of a transistor may be defined by the total cross-sectional area through which current can flow, referred to as "current flow area" herein. As an example, for a field-effect transistor, the size of the transistor may be characterized by gate width.

The principles described herein are not limited to what the relative size is between the transistors. However, in some embodiments, the ratio of the current flow area of the power transistor 110 over the current flow area of the sense transistor 120 is 500 or more. Further, in some embodiments, the power transistor 110 and the sense transistor 120 may be gallium-nitride field-effect transistors. However, the principles described herein are not limited to the types of the transistors 110 and 120, although it is preferred that the transistors 110 and 120 are the same type, or even constructed in the same epitaxial stack. Nevertheless, to represent that the principles described herein are not restricted to the transistors 110 and 120 being of the same type, the power transistor 110 and the sense transistor 120 are represented symbolically using trapezoidal boxes. Trapezoidal boxes are also used in FIG. 2 to represent transistors where the transistor may be of any type. As an example, transistors represented as trapezoids in each of FIGS. 1 and 2 may be gallium nitride transistors, high-electron mobility field-effect transistors, or any other type of transistor.

The power transistor 110 includes a control node 111 that controls whether current flows from an input node 112 of the power transistor 110 to an output node 113 of the power transistor 110. The sense transistor 120 also has a control node 121 that controls whether current flows from an input node 122 of the sense transistor 120 to an output node 123 of the sense transistor 120. The control node 111 of the power transistor 110 and the control node 121 of the sense transistor 120 are connected together. The on-off state of each of the power transistor 110 and the sense transistor 120 are controlled by whether a voltage $V_C$ applied to the control node 111 and the control node 121 is high or low. Furthermore, the output node 113 of the power transistor 110 and the output node 123 of the sense transistor 120 are connected together. In some embodiments, the connected output nodes 113 and 123 are grounded, or may be connected to a reference voltage node. In any case, the output nodes 113 and 123 are connected to a circuit current sink 142 that is capable of sinking current.

In operation, while the current sense circuit 100 is on (herein referred to as an "ON state"), the control voltage $V_C$ applied to the connected control nodes 111 and 121 is in one state (e.g., a high state) that causes the power transistor 110 and the sense transistor 120 to conduct current. In this ON state, the power transistor 110 passes an amount of power current that is sourced by a circuit current source 141. The current that passes in this ON state from the circuit current source 141 through the power transistor 110 and to the circuit current sink 142 is referred to herein and in the drawings as current $I_{Power}$. In contrast, when the current sense circuit 100 is off (herein referred to as an "OFF state"), each of the power transistor 110 and the sense transistor 120 is off. The embodiments described herein more accurately determine the power current $I_{Power}$ as the power transistor 110 ages. The ON state will now be described in detail.

While the current sense circuit 100 is in this ON state, the sense transistor 120 passes a sense current $I_{Sense}$. The sense current $I_{Sense}$ is sourced from circuit current source 143 and passes through the sense transistor 120 to the circuit current sink 142. For instance, perhaps the pull-up component 130 operates to allow sense current $I_{Sense}$ to pass from the circuit current source 141 to the sense transistor 120. However, in an embodiment described below, the circuit current source 143 is a separate current source as compared to the circuit current source 141.

In some embodiments, the power current $I_{Power}$ is largely proportional to the sense current $I_{Sense}$, even across a wide variety of operating conditions, the sense current $I_{Sense}$ being much smaller than the power current $I_{Power}$. Thus, a signal representing the sense current $I_{Sense}$ can be used to generate a signal representing the power current $I_{Power}$. The reason that the sense current $I_{Sense}$ is proportional to the power current $I_{Power}$ in the ON state is that the sense transistor 120 is an approximate replica of the power transistor 110, except for the current flow area of the power transistor 110 being N times larger than the current flow area of the sense transistor 120. For example, the sense transistor 120 may be a miniaturized replica of the power transistor 110 when the active region of both are fabricated using the same epitaxial stack, except with the active area being N times larger for the power transistor 110. Thus, the on-resistance of the sense transistor 120 is N times that of the power transistor 110.

Furthermore, in the ON state, the control voltage $V_C$ applied to the control nodes 111 and 121 is the same, and the output voltage present at the output nodes 113 and 123 is also the same. Accordingly, if the voltage applied at the input nodes 112 and 122 can be made at least proportional to each other (even if not the same), the sense current $I_{Sense}$ will be proportional to the power current $I_{Power}$ with a certain constant of proportionality. This constant of proportionality will remain approximately the same over time provided that the ratio of the on-resistance of the sense transistor 120 over the on-resistance of the power transistor 110 remains the same.

As previously expressed, the on-resistance of a transistor may increase as the transistor ages, as will now be explained. For context, the current sensing circuit 100 may be implemented into a large power system requiring hundreds of volts. That is, while the power transistor 110 is off, the power transistor 110 may be required to handle a voltage difference of hundreds of volts between its input node 112 and output node 113. Such large voltage drops may cause the power transistor 110 to degrade over time and become less efficient due to an increase in on-resistance. This increase results in more power lost due to heat and a larger voltage drop over the power transistor 110 while on. This phenomenon is referred to as aging.

As previously mentioned, if the ratio of the on-resistance of the sense transistor 120 over the on-resistance of the power transistor 110 remains the same, the constant of proportionality between the sense current $I_{Sense}$ and the power current $I_{Power}$ should remain the same. The principles described herein aim to at least partially accomplish this by pulling up the voltage at the input node 122 of the sense transistor 120 when the current sense circuit 100 is operating in the OFF state.

The embodiments described herein promote aging of the sense transistor 120 at closer to the same rate as the power transistor 110 is aging. That is, the principles described herein encourage the on-resistance of the sense transistor 120 to increase in better proportion to what the power transistor 110 is undergoing. This is accomplished by forcing the sense transistor 120 to sustain a voltage difference in the OFF state that is larger than what the sense transistor 120 would otherwise experience in the absence of pulling up its input voltage. For example, to force the sense transistor 120 to undergo the same voltage drop in the OFF state as the power transistor 110 is undergoing in the OFF state, the input voltage of the sense transistor 120 should be the same as the input voltage of the power transistor 110 in the OFF state.

To accomplish this, the pull-up component 130 is connected between the input node 112 of the power transistor 110 and the input node 122 of the sense transistor 120. In operation, when the current sense circuit 100 is in the OFF state, each of the power transistor 110 and the sense transistor 120 is off, and the pull-up component 130 forces a voltage $V_{INSenseOFF}$ present at the input node 122 of the sense transistor 120 to be approximately equal to a voltage $V_{INPowerOFF}$ present at the input node 112 of the power transistor 110. In other words, the pull-up component 130 "pulls up" the voltage $V_{INSenseOFF}$ to be approximately the same as the voltage $V_{INPowerOFF}$, hence the term "pull-up component". For example, while the current sense circuit 100 is in the OFF state, the voltage $V_{INPowerOFF}$ at the input node 112 of the power transistor 110 may be 650 volts. In this scenario, the pull-up component 130 may force the voltage $V_{INSenseOFF}$ at the input node 122 of the sense transistor 120 to also be approximately 650 volts.

Accordingly, while the current sense circuit 100 is in the OFF state, both of the power transistor 110 and the sense transistor 120 experience approximately the same voltage difference. Thus, over time, the power transistor 110 and the sense transistor 120 should age more similarly, and the ratio of power current $I_{Power}$ to sense current $I_{Sense}$ should remain approximately constant. In this manner, even after aging, the signal representing the sense current $I_{Sense}$ may still be used with the same proportionality to accurately generate the signal representing the power current $I_{Power}$.

However, in some embodiments, the pull-up component 130 may only force the voltage $V_{INSenseOFF}$ at the input node 122 of the sense transistor 120 to be some fraction of the voltage $V_{INPowerOFF}$ present at the input node 112 of the power transistor 110. As an example, that fraction might be twenty percent or more, fifty percent or more, or eighty percent or more. This would still be beneficial because, even though the sense transistor 120 would age slower than the power transistor 110, the signal representing the sense current $I_{Sense}$ could still be used to accurately generate (within a margin of error) the signal representing the power current $I_{Power}$ for a longer period of time compared to if the sense transistor 120 did not age at all, or at least did not age with the assistance of the pull-up component 130.

Figure 2:
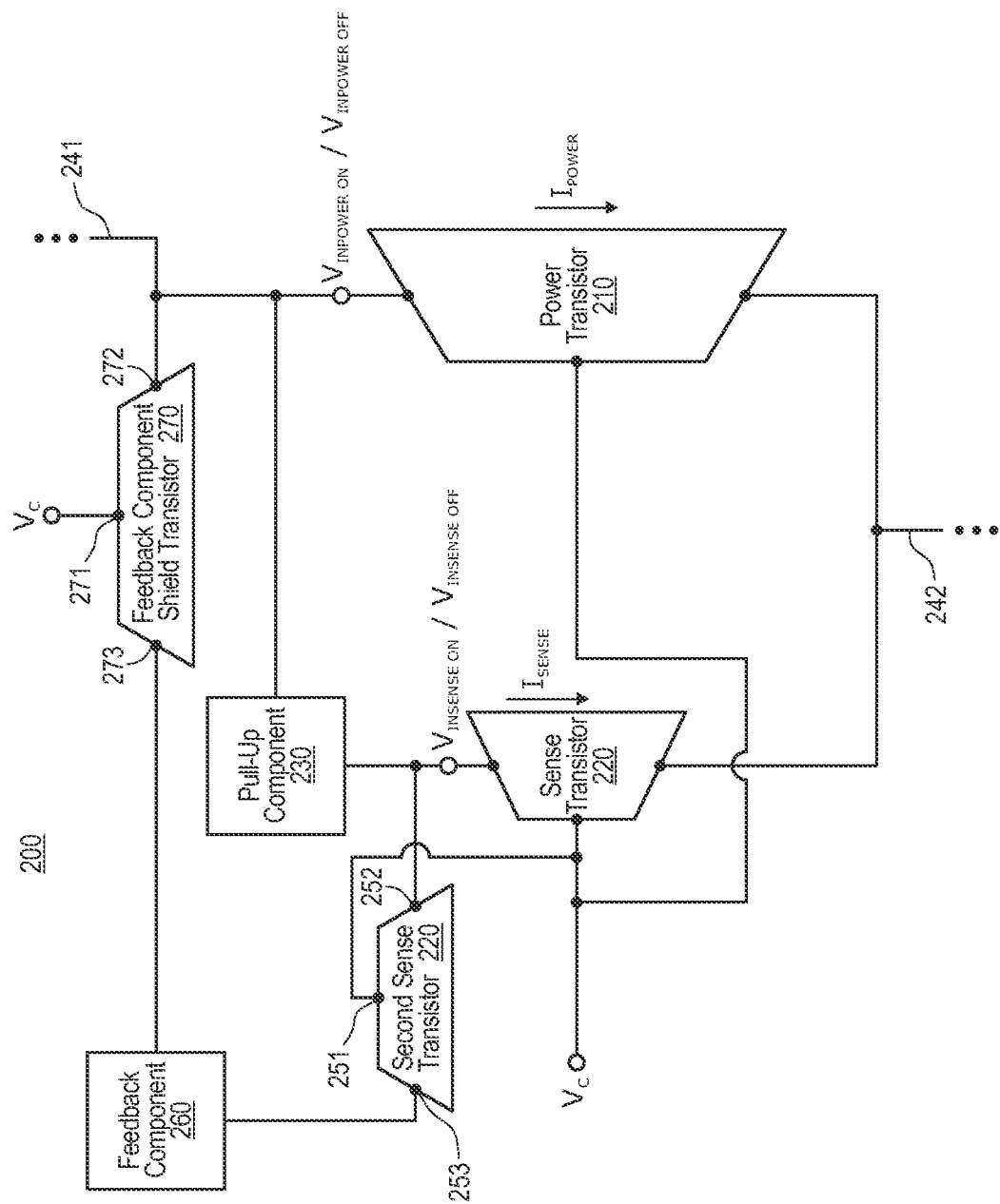
FIG. 2 illustrates an example current sense circuit that is an example of the current sense circuit of FIG. 1.

FIG. 2 illustrates an example current sense circuit 200 that is an example of the current sense circuit 100 of FIG. 1. Specifically, the power transistor 210, the first sense transistor 220, the pull-up component 230, the circuit current source 241 and the circuit current sink 242 are respective examples of the power transistor 110, the first sense transistor 120, the pull-up component 130, the circuit current source 141 and the circuit current sink 142 of FIG. 1. However, the current sense circuit 200 further includes a second sense transistor 250, a feedback component 260 and a feedback component shield transistor 270, which collectively act as an example of the circuit current source 143 of FIG. 1, as will be described further below.

A control node 251 of the second sense transistor 250 and a control node 271 of the feedback component shield transistor 270 are connected to each other, as well as to the control nodes of each of the power transistor 210 and the first sense transistor 220. An input node 252 of the second sense transistor 250 is connected to the input node of the first sense transistor 220. The pull-up component 230 is connected between the input node of the power transistor 210 and the connected input node 252 of the second sense transistor 250. An input node 272 of the feedback component shield transistor 270 is connected to the input node of the power transistor 210. The feedback component 260 is connected between an output node 253 of the second sense transistor 250 and an output node 273 of the feedback component shield transistor 270.

The operation of the current sense circuit 200 will now be described. While the current sense circuit 200 is in its ON state, each of the power transistor 210, first sense transistor 220, second sense transistor 250, and feedback component shield transistor 270 are on. Additionally, while the current sense circuit 200 is in its ON state, the pull-up component 230 may act as an open circuit, as will be explained later. Furthermore, while in this ON state, the power current $I_{Power}$ passes through the power transistor 210. The power transistor 210 has a small amount of on-resistance, resulting in a small voltage $V_{INPowerON}$ being present at the input node of the power transistor 210. Since the feedback component shield transistor 270 is on, this small voltage $V_{INPowerON}$ is input into the feedback component 260. The feedback component 260 provides a feedback component output voltage to the output node 253 of the second sense transistor 250. The feedback component output voltage is proportional to the voltage $V_{INPowerON}$ present at the input node of the power transistor 210.

In this ON state, the first sense transistor 220 and the second sense transistor 250 are on (with some on resistance) and coupled in series between the output of the feedback component and the circuit current sink 242 (which may be ground). Thus, the application of the feedback component output voltage from the feedback component 260 causes the sense current $I_{Sense}$ to be passed through the second sense transistor 250 and the first sense transistor 220. The current sense current $I_{Sense}$ is proportional to the power current $I_{Power}$ because the on-resistance of the series combination of the first second transistor 220 and the second sense transistor 250 is proportion to the on-resistance of the power transistor (for reason described below), and also because the feedback component output voltage is proportional to the input voltage $V_{INPowerON}$ present at the input node of the power transistor 210.

The on-resistances are approximately proportional for reasons now described. The second sense transistor 250 is an approximate replica of the power transistor 210, except for the current flow area of the power transistor 210 being M times larger than the current flow area of the second sense transistor 250. For example, the second sense transistor 250, similar to the first sense transistor 220, may be a miniaturized replica of the power transistor 210 when the active regions of both transistors are fabricated using the same epitaxial stack, except the current flow area being M times larger for the power transistor 210. Recall that the first sense transistor 220 is an approximate replica of the power transistor 210, except for the current flow area of the power transistor 210 being N times larger than the current flow area of the first sense transistor 220.

In the case of the first sense transistor 220 and the second sense transistor 250 having the same current flow area, M would be equal to N. This being the case, the on-resistance of the first sense transistor 220 is N times that of the power transistor 210, and the on-resistance of the second sense transistor 250 is M times that of the power transistor 210. The series resistance of the first sense transistor 220 and the second sense transistor 250 would thus M+N times that of the power transistor 210. Since M and N are each constants, this means that the on-resistance of the power transistor 210 is proportional to the combined on-resistances of the first sense transistor 220 and the second sense transistor 250. Thus, in the ON state, the sense current $I_{Sense}$ is approximately proportional to the power current $I_{Power}$, allowing for accurate generation of the signal representing the power current $I_{Power}$.

While the current sense circuit 200 is in its OFF state, the aim is to cause the sense transistors 220 and 250 to age approximately equal to (but at least proportional to) the aging that the power transistor 210 undergoes in the OFF state. In the OFF state, each of the power transistor 210, first sense transistor 220, second sense transistor 250 and feedback component shield transistor 270 are off. Further, while the current sense circuit 200 is in the OFF state, the pull-up component 230 forces the voltage $V_{INSenseOFF}$ present at the input node of the first sense transistor 220 and the input node 252 of the second sense transistor 250 to be approximately equal to the voltage $V_{INPowerOFF}$ present at the input node of the power transistor 210.

Further, because the feedback component shield transistor 270 is off, the voltage received at the input to the feedback component 260 quickly degrades to be zero volts. At that point, the feedback component 260 also outputs zero volts. Therefore, the voltage at the output node 253 of the second sense transistor 250 is approximately zero volts. Likewise, in the scenario of circuit current sink 242 being grounded, the voltage at the output nodes of the power transistor 210 and the first sense transistor 220 is also approximately zero volts. Accordingly, while the current sense circuit 200 is in the OFF state, each of the power transistor 210, first sense transistor 220 and second sense transistor 250 experience approximately the same large voltage drop, and thus age at approximately the same rate.

Therefore, even though the power transistor 210 ages, the first sense transistor 220 and the second transistor 250 also age approximately equally. Specifically, the percentage increase in the on-resistances of each of the first sense transistor 220 and the second sense transistor 250 is approximately equal to the percentage increase in the on-resistance of the power transistor 210. Accordingly, the proportionality between the power current $I_{Power}$ and the sense current $I_{Sense}$ will also remain relatively constant. Thus, throughout a longer period of aging, the current sense circuit 200 may be used to generate an accurate representation of the power current power current $I_{Power}$.

Figure 3:
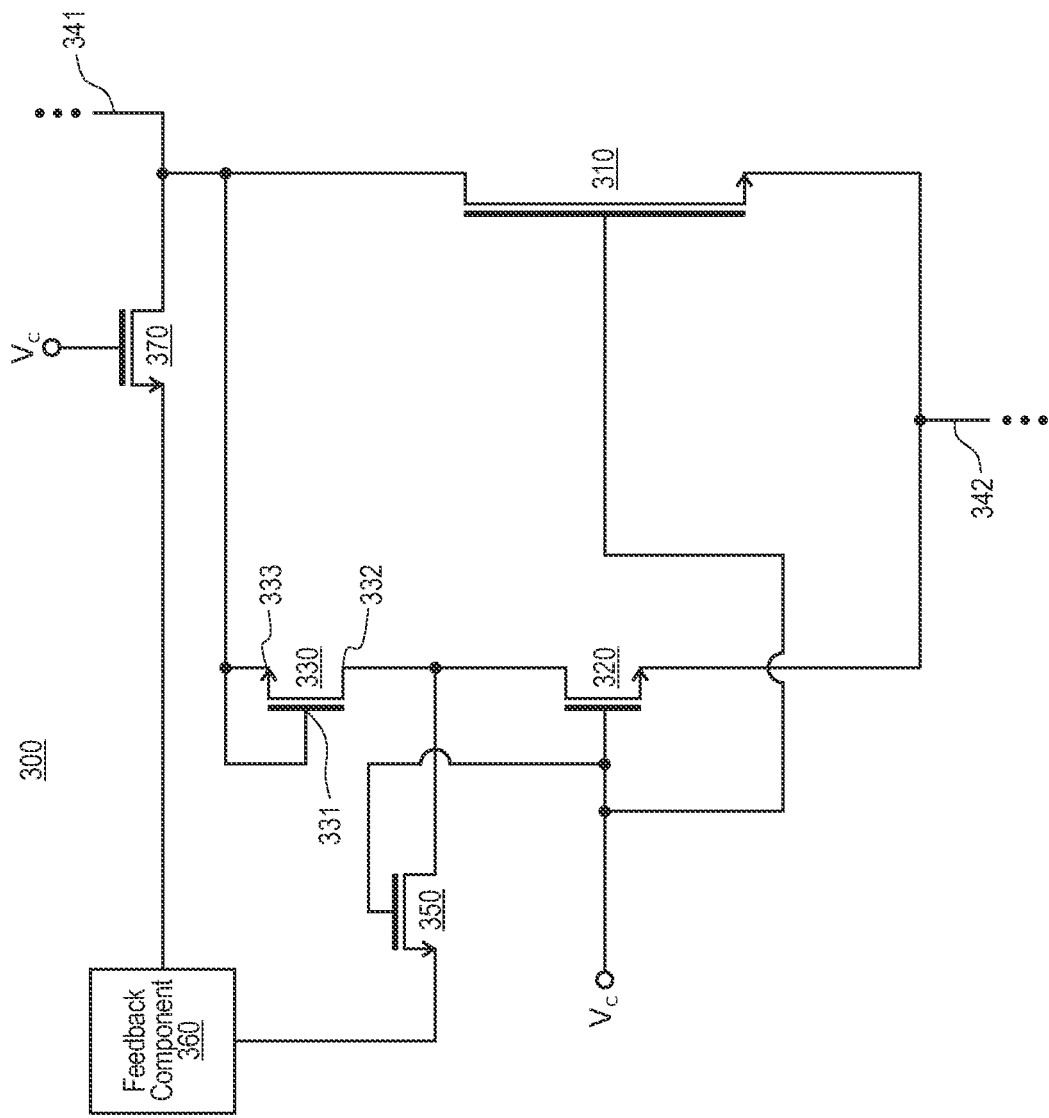
FIG. 3 illustrates an example current sense circuit that is an example of the current sense circuit of FIG. 2, but in which the transistors are field-effect transistors and the pull-up component is a diode-connected field-effect transistor.

In some embodiments, each of these transistors 210, 220, 250 and 270 may be the same type of transistor, even if not constructed from the same epitaxial stack. As the principles described herein are not limited to the types of the transistors 210, 220, 250 and 270, the transistor, these transistors are each also represented symbolically using trapezoidal boxes. However, in a more specific embodiment, the transistors may be field-effect transistors. FIG. 3 illustrates such an embodiment.

FIG. 3 illustrates an example current sense circuit 300 that is an example of the current sense circuit 200 of FIG. 2. However, in FIG. 3, each of the transistors 310, 320, 350 and 370 are examples of the respective transistors 210, 220, 250 and 270 in a case in which the transistor are each field-effect transistors. Each of the control nodes, input nodes, and output nodes of the transistors are respective gate terminals, drain terminals, and source terminals of the field-effect transistors.

Furthermore, a pull-up component field-effect transistor 330 is illustrated as an example of the pull-up component 230 of FIG. 2. The pull-up field effect transistor 330 is connected in diode-configuration, allowing current to flow downward, but not upward. A control node 331 and an output node 333 of the pull-up component field-effect transistor 330 are connected to the input node of the power field-effect transistor 310. An input node 332 of the pull-up component field-effect transistor 330 is connected to the input node of the first sense field-effect transistor 320 and to the input node of the second field-effect transistor 350.

Figure 4:
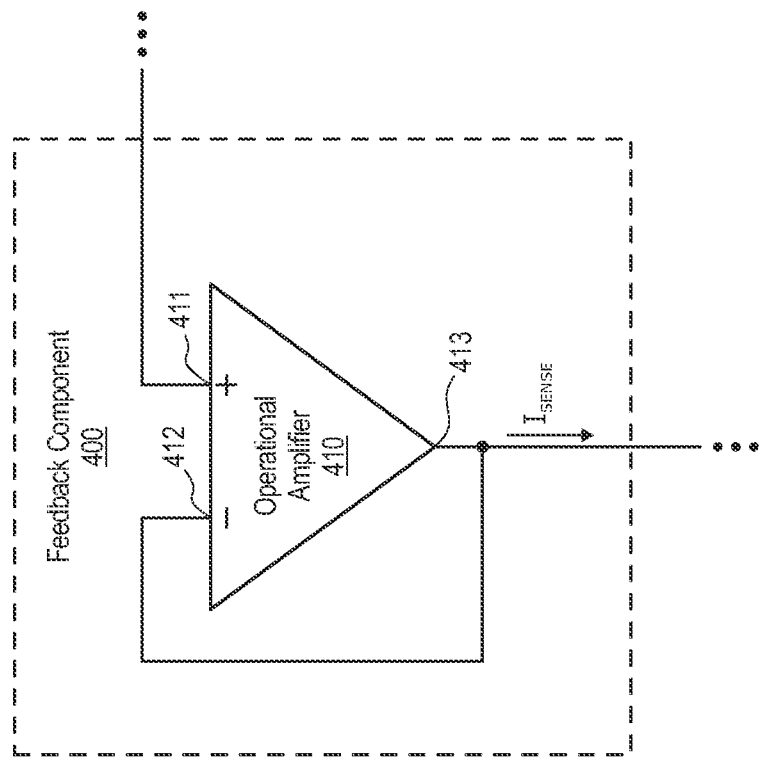
FIG. 4 illustrates a feedback component, which is an example of the feedback component of FIG. 3.

Similar to the feedback component 260 of FIG. 2, the feedback component 360 of FIG. 3 is configured to, when provided with a voltage via the feedback component field-effect transistor 370, pass the sense current $I_{Sense}$ through the second sense field-effect transistor 350 and the first sense field-effect transistor 320. In order to perform such a function, the feedback component 360 may, for example, comprise an operational amplifier, or the like. FIG. 4 illustrates such an example.

FIG. 4 illustrates a feedback component 400, which is an example of the feedback component 360 of FIG. 3. The feedback component 400 includes an operational amplifier 410. The operational amplifier 410 has a positive input node 411, a negative input node 412 and an output node 413. The positive input node 411 may be connected to the output node of the feedback component shield field-effect transistor 370 of FIG. 3. The output node 413 of the operational amplifier 410 is connected to the negative input node 412 of the operational amplifier 410, thus creating a negative feedback loop that causes the output voltage present at the output node 413 to be approximately equal to the input voltage present at the positive input node 411. The output node 413 of the operational amplifier 410 may be connected to the output node of the second sense field-effect transistor 350 of FIG. 3.

The operational amplifier 410 may optionally be constructed on a separate integrated chip, and not on the same semiconductor substrate as the transistors 310, 320, 330, 350 and 370 of FIG. 3. Incidentally, if the operational amplifier 410 is constructed on a separate silicon integrated chip, the operational amplifier 410 would likely not be able to withstand the same high voltages that the transistors 310, 320, 350 and 370 of FIG. 3 could withstand as, for example, gallium-nitride field-effect transistors. Accordingly, an advantage of the current sense circuit 300 of FIG. 3 is its ability to use the feedback component shield field-effect transistor 370 and the second sense field-effect transistor 350 to isolate (i.e., to "shield") the feedback component 360 (or the operational amplifier 410 of FIG. 4). In this manner, the feedback component 360 is not exposed to the high voltages at the input nodes of the power field-effect transistor 310 and the first sense field-effect transistor 320 while the current sense circuit 300 is in its OFF state.

Accordingly, what has been described is a current sense circuit that allows for accurate sensing of a power current that flows through a power transistor as the power transistor ages.

Literal Support Section

Clause 1. A current sense circuit comprising: a power transistor having a power transistor control node that controls whether current flows from a power transistor input node to a power transistor output node; a sense transistor having a sense transistor control node that controls whether current flows from a sense transistor input node to a sense transistor output node, the sense transistor control node connected to the power transistor control node; and a pull-up component connected between the power transistor input node and the sense transistor input node, the pull-up component being structured such that, when power is provided to the pull-up component and when the power transistor and the sense transistor are off, the pull-up component is structured to cause a sense transistor input node voltage at the sense transistor input node to be at least half of a power transistor input node voltage at the power transistor input node.

Clause 2. The current sense circuit according to Clause 1, the sense transistor being a first sense transistor, the sense transistor control node being a first sense transistor control node, the sense transistor input node being a first sense transistor input node, the sense transistor output node being a first sense transistor output node, the current sense circuit further comprising: a second sense transistor having a second sense transistor control node that controls whether current flows from a second sense transistor input node to a second sense transistor output node, the second sense transistor control node connected to the power transistor control node and to the first sense transistor control node, the second sense transistor input node connected to the first sense transistor input node.

Clause 3. The current sense circuit according to Clause 2, further comprising: a feedback component connected between the power transistor input node and the second sense transistor output node, the feedback component being configured to, when each of the power transistor, first sense transistor and second sense transistor are on, generate a sense current that flows through the second sense transistor and first sense transistor, the sense current being a function of a power current flowing through the power transistor.

Clause 4. The current sense circuit according to Clause 3, wherein the feedback component comprises an operational amplifier including a first operational amplifier input node, a second operational amplifier input node, and an operational amplifier output node, the second operational amplifier input node connected to the second sense transistor output node, the operational amplifier output node also connected to the second sense transistor output node.

Clause 5. The current sense circuit according to claim 4, the current sense circuit further comprising a feedback component shield transistor having a feedback component shield transistor control node that controls whether current flows from a feedback component shield transistor input node to a feedback component shield transistor output node, the feedback component shield transistor input node connected to the power transistor input node, the feedback component shield transistor output node connected to the first operational amplifier input node.

Clause 6. The current sense circuit according to Clause 3, wherein the feedback component is included in a silicon integrated chip.

Clause 7. The current sense circuit according to Clause 3, the function being a proportional function.

Clause 8. The current sense circuit according to Clause 7, the proportional function being an approximately proportional function.

Clause 9. The current sense circuit according to Clause 2, wherein each of the power transistor, the first sense transistor and the second sense transistor are gallium nitride transistors.

Clause 10. The current sense circuit according to Clause 2, wherein each of the power transistor, the first sense transistor and the second sense transistor are high-electron mobility transistors.

Clause 11. The current sense circuit according to Clause 2, wherein the pull-up component comprises a pull-up transistor that has a pull-up transistor control node that controls whether current flows from a pull-up transistor input node to a pull-up transistor output node, the pull-up transistor output node connected to the power transistor input node, the pull-up transistor control node also connected to the power transistor input node, and the pull-up transistor input node connected to the first sense transistor input node and the second sense transistor input node.

Clause 12. The current sense circuit according to Clause 1, wherein each of the power transistor and the sense transistor are gallium nitride transistors.

Clause 13. The current sense circuit according to Clause 1, wherein each of the power transistor and the sense transistor are field-effect transistors.

Clause 14. The current sense circuit according to Clause 1, wherein the pull-up component is a pull-up transistor that has a pull-up transistor control node that controls whether current flows from a pull-up transistor input node to a pull-up transistor output node, the pull-up transistor output node connected to the power transistor input node, the pull-up transistor control node also connected to the power transistor input node, and the pull-up transistor input node connected to the sense transistor input node.

Clause 15. The current sense circuit according to Clause 1, the power transistor and the sense transistor each having active regions formed from a same epitaxial stack.

Clause 16. The current sense circuit according to Clause 15, herein a size ratio of a current flow area of the power transistor over a current flow area of the sense transistor is 500 or more.

Clause 17. The current sense circuit according to Clause 1, herein a size ratio of a current flow area of the power transistor over a current flow area of the sense transistor is 500 or more.

Clause 18. A current sense circuit comprising: a power transistor having a power transistor control node that controls whether current flows from a power transistor input node to a power transistor output node; a sense transistor having a sense transistor control node that controls whether current flows from a sense transistor input node to a sense transistor output node, the sense transistor control node connected to the power transistor control node; and a pull-up component connected between the power transistor input node and the sense transistor input node, the pull-up component being structured such that, when power is provided to the pull-up component and when the power transistor and the sense transistor are off, the pull-up component is structured to cause a sense transistor input node voltage at the sense transistor input node to be at least twenty percent of a power transistor input node voltage at the power transistor input node.

Clause 19. The current sense circuit in accordance with Clause 18, wherein the pull-up component is structured to cause the sense transistor input node voltage at the sense transistor input node to be at least half of the power transistor input node voltage at the power transistor input node.

Clause 20. The current sense circuit in accordance with Clause 18, wherein the pull-up component is structured to cause the sense transistor input node voltage at the sense transistor input node to be at least eighty percent of the power transistor input node voltage at the power transistor input node.

Although the subject matter has been described in language specific to structural features and/or methodological acts, it is to be understood that the subject matter defined in the appended claims is not necessarily limited to the described features or acts described above, or the order of the acts described above. Rather, the described features and acts are disclosed as example forms of implementing the claims.

The present disclosure may be embodied in other specific forms without departing from its essential characteristics. The described embodiments are to be considered in all respects only as illustrative and not restrictive. All changes which come within the meaning and range of equivalency of the claims are to be embraced within their scope.

When introducing elements in the appended claims, the articles "a," "an," "the," and "said" are intended to mean there are one or more of the elements. The terms "comprising," "including," and "having" are intended to be inclusive and mean that there may be additional elements other than the listed elements.

What is claimed:

1. A current sense circuit comprising:
a power transistor having a power transistor control node that controls whether current flows from a power transistor input node to a power transistor output node;
a sense transistor having a sense transistor control node that controls whether current flows from a sense transistor input node to a sense transistor output node, the sense transistor control node connected to the power transistor control node, the power transistor and the sense transistor each having active regions formed from a same epitaxial stack; and
a pull-up component connected between the power transistor input node and the sense transistor input node, the pull-up component being structured such that, when power is provided to the pull-up component and when the power transistor and the sense transistor are off, the pull-up component is structured to cause a sense transistor input node voltage at the sense transistor input node to be at least half of a power transistor input node voltage at the power transistor input node.

2. The current sense circuit according to claim 1, the sense transistor being a first sense transistor, the sense transistor control node being a first sense transistor control node, the sense transistor input node being a first sense transistor input node, the sense transistor output node being a first sense transistor output node, the current sense circuit further comprising:
a second sense transistor having a second sense transistor control node that controls whether current flows from a second sense transistor input node to a second sense transistor output node, the second sense transistor control node connected to the power transistor control node and to the first sense transistor control node, the second sense transistor input node connected to the first sense transistor input node.

3. The current sense circuit according to claim 2, further comprising:
a feedback component connected between the power transistor input node and the second sense transistor output node, the feedback component being configured to, when each of the power transistor, first sense transistor and second sense transistor are on, generate a sense current that flows through the second sense transistor and first sense transistor, the sense current being a function of a power current flowing through the power transistor.

4. The current sense circuit according to claim 3, wherein the feedback component comprises an operational amplifier including a first operational amplifier input node, a second operational amplifier input node, and an operational amplifier output node, the second operational amplifier input node connected to the second sense transistor output node, the operational amplifier output node also connected to the second sense transistor output node.

5. The current sense circuit according to claim 4, the current sense circuit further comprising a feedback component shield transistor having a feedback component shield transistor control node that controls whether current flows from a feedback component shield transistor input node to a feedback component shield transistor output node, the feedback component shield transistor input node connected to the power transistor input node, the feedback component shield transistor output node connected to the first operational amplifier input node.

6. The current sense circuit according to claim 3, wherein the feedback component is included in a silicon integrated chip.

7. The current sense circuit according to claim 3, the function being a proportional function.

8. The current sense circuit according to claim 7, the proportional function being an approximately proportional function.

9. The current sense circuit according to claim 2, wherein each of the power transistor, the first sense transistor and the second sense transistor are gallium nitride transistors.

10. The current sense circuit according to claim 2, wherein each of the power transistor, the first sense transistor and the second sense transistor are high-electron mobility transistors.

11. The current sense circuit according to claim 2, wherein the pull-up component comprises a pull-up transistor that has a pull-up transistor control node that controls whether current flows from a pull-up transistor input node to a pull-up transistor output node, the pull-up transistor output node connected to the power transistor input node, the pull-up transistor control node also connected to the power transistor input node, and the pull-up transistor input node connected to the first sense transistor input node and the second sense transistor input node.

12. The current sense circuit according to claim 1, wherein each of the power transistor and the sense transistor are gallium nitride transistors.

13. The current sense circuit according to claim 1, wherein each of the power transistor and the sense transistor are field-effect transistors.

14. The current sense circuit according to claim 1, wherein the pull-up component is a pull-up transistor that has a pull-up transistor control node that controls whether current flows from a pull-up transistor input node to a pull-up transistor output node, the pull-up transistor output node connected to the power transistor input node, the pull-up transistor control node also connected to the power transistor input node, and the pull-up transistor input node connected to the sense transistor input node.

15. The current sense circuit according to claim 1, wherein a size ratio of a current flow area of the power transistor over a current flow area of the sense transistor is 500 or more.

16. A current sense circuit comprising:
a power transistor having a power transistor control node that controls whether current flows from a power transistor input node to a power transistor output node;
a sense transistor having a sense transistor control node that controls whether current flows from a sense transistor input node to a sense transistor output node, the sense transistor control node connected to the power transistor control node, the power transistor and the sense transistor each having active regions formed from a same epitaxial stack; and
a pull-up component connected between the power transistor input node and the sense transistor input node, the pull-up component being structured such that, when power is provided to the pull-up component and when the power transistor and the sense transistor are off, the pull-up component is structured to cause a sense transistor input node voltage at the sense transistor input node to be at least twenty percent of a power transistor input node voltage at the power transistor input node.

17. The current sense circuit in accordance with claim 16, wherein the pull-up component is structured to cause the sense transistor input node voltage at the sense transistor input node to be at least eighty percent of the power transistor input node voltage at the power transistor input node.

18. A current sense circuit comprising:
a power transistor having a power transistor control node that controls whether current flows from a power transistor input node to a power transistor output node;
a sense transistor having a sense transistor control node that controls whether current flows from a sense transistor input node to a sense transistor output node, the sense transistor control node connected to the power transistor control node; and
a pull-up component connected between the power transistor input node and the sense transistor input node, the pull-up component being structured such that, when power is provided to the pull-up component and when the power transistor and the sense transistor are off, the pull-up component is structured to cause a sense transistor input node voltage at the sense transistor input node to be at least half of a power transistor input node voltage at the power transistor input node wherein the pull-up component is a pull-up transistor that has a pull-up transistor control node that controls whether current flows from a pull-up transistor input node to a pull-up transistor output node, the pull-up transistor output node connected to the power transistor input node, the pull-up transistor control node also connected to the power transistor input node, and the pull-up transistor input node connected to the sense transistor input node.

19. The current sense circuit according to claim 18, wherein a size ratio of a current flow area of the power transistor over a current flow area of the sense transistor is 500 or more.

* * * * *